(12) United States Patent
Leonard et al.

(10) Patent No.: US 7,348,915 B2
(45) Date of Patent: Mar. 25, 2008

(54) PROGRAMMABLE DIGITAL FILTER SYSTEM

(75) Inventors: Jeramy S. Leonard, Addison, TX (US); William D. Elliott, Parker, TX (US); Thomas P. Magdeburger, Murphy, TX (US)

(73) Assignee: Quickfilter Technologies, Inc., Allen, TX (US)

( * ) Notice: Subject to any disclaimer, the term of this patent is extended or adjusted under 35 U.S.C. 154(b) by 0 days.

(21) Appl. No.: 11/489,226

(22) Filed: Jul. 19, 2006

(65) Prior Publication Data

US 2008/0018511 A1    Jan. 24, 2008

(51) Int. Cl.
*H03M 1/12* (2006.01)
(52) U.S. Cl. .................................................. 341/155
(58) Field of Classification Search ................ 341/166, 341/155; 370/290; 379/406.08
See application file for complete search history.

(56) References Cited

U.S. PATENT DOCUMENTS

| | | | |
|---|---|---|---|
| 4,958,277 A | | 9/1990 | Hill et al. |
| 4,983,975 A | * | 1/1991 | Sugino et al. ............... 341/166 |
| 5,365,545 A | * | 11/1994 | Blackwell et al. ........... 375/222 |
| 5,630,152 A | | 5/1997 | DeLuca et al. |
| 6,308,191 B1 | | 10/2001 | Dujardin et al. |
| 6,353,908 B1 | | 3/2002 | Heinrich |
| 6,370,556 B1 | | 4/2002 | Saramaki et al. |
| 6,665,593 B2 | | 12/2003 | Otterbach et al. |
| 6,980,771 B1 | * | 12/2005 | Yang .......................... 455/63.1 |
| 7,013,319 B1 | | 3/2006 | Gentile |

OTHER PUBLICATIONS

Timo Solla, Olli Vainio, Comparison of Programmable FIR Filter Architectures for Low Power, ESSCIRC 2002, pp. 759-762.
Freescale Semiconductor, Inc., SPI Block Guide V03.06, Jan. 21, 2000, pp. 1-38, Document No. S12SPIV3/D.

* cited by examiner

*Primary Examiner*—Brian Young
(74) *Attorney, Agent, or Firm*—John A. Thomas

(57) ABSTRACT

An analog-to-digital conversion system has an analog-to-digital converter and a digital-filter system. The digital-filter system is connected to the output of the analog-to-digital converter. A processor is connected to the output of the digital-filter system so that the processor transparently receives filtered sample data in the native format of the analog-to-digital converter. An FIR filter circuit in the digital-filter system is connected to receive data from, and output filtered data to, a sample capture and data-type conversion circuit connected between the analog-to-digital converter and the processor. A configuration and control-register circuit is connected to the circuit for sample collection and data-type conversion, and to the FIR filter circuit, for selectively controlling the operation of the digital filter system according to parameters for data conversion and filter operation passed to the configuration and control-register circuit over a serial interface.

34 Claims, 15 Drawing Sheets

Digital Filter System Block Diagram

Digital Filter System Block Diagram

Sample Pipeline

Coprocessor Configuration

Serial Interface Normal Configuration

Serial Sync Configuration

Serial Filter Configuration

Sample Capture and Data Type Conversion

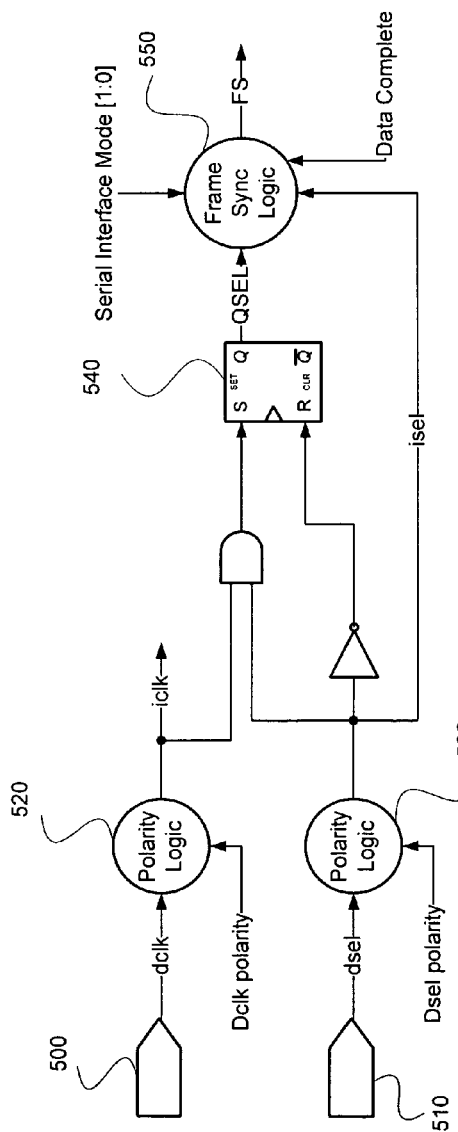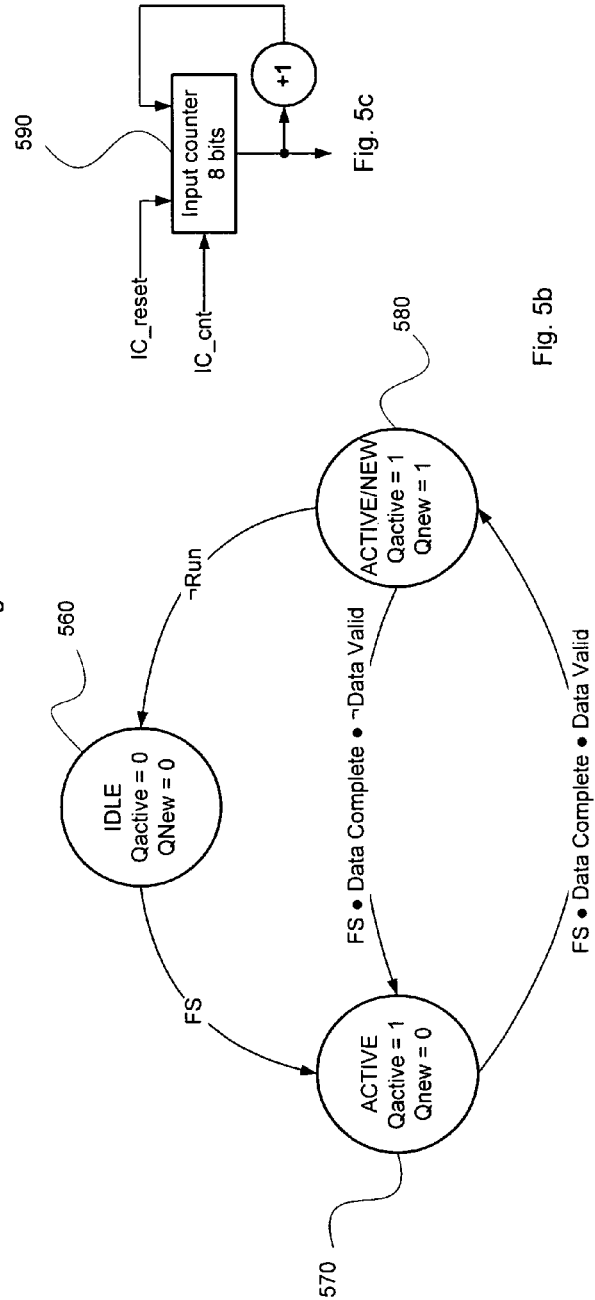

Sample Extraction from Serial Bit Stream

FIR Address Control

Configuration Download Bit Stream Protocol

SPI Configuration Logic

PRIOR ART

PROGRAMMABLE DIGITAL FILTER SYSTEM

CO-PENDING APPLICATIONS AND INCORPORATION BY REFERENCE

The present application is related to U.S. patent application Ser. No. 11/223,356 filed Sep. 9, 2005, and having the title of "Data structures and circuit for multi-channel data transfers using a serial peripheral interface," which application is incorporated by reference into the present application.

TECHNICAL FIELD

This disclosure relates to the implementation of an easy-to-use, efficient, low power, digital filtering Integrated Circuit (IC) readily interfaced to a variety of serial output analog-to-digital (ADC) converters as used in digital-signal processing applications.

BACKGROUND

Digital filtering of signals after analog-to-digital conversion is necessary to extract the useful content from the signal processing information stream. In a typical application, only information content at a specific frequency of interest is useful. It is usually essential to filter out all frequency content other than the frequency of interest.

The convolution sum for a non-linear finite-impulse response (FIR) filter is of the form:

$$y(n) = \sum_{i=0}^{N-1} b(i) x(n-i)$$

Where:
y(n)=filter output for sample time n
b(i)=filter coefficients for filter of order N−1
x(n)=filter input at sample time n
N=number of filter taps A "folded" or "symmetric" FIR filter, for linear FIR filters, has the following form:

$$y(n) = \sum_{i=0}^{\mathrm{ceil}((N-1)/2)} b(i)[x(i)+x(n-1-i)]$$

The latter format permits the filter tap counts to be doubled within the same timing and resources of a non-linear FIR, compared to the non-symmetric case.

Digital filtering in most of today's systems is done in a microprocessor (µP) or micro-controller, digital-signal processor (DSP), field-programmable gate array (FPGA), or a combination thereof. Digital filters required for precision extraction of desired signals from unwanted signals or noise are very computationally intensive, and quickly overwhelm the resources in DSP's or µP's. FPGA solutions require expensive, power-hungry devices and difficult, and custom-application design cycles Reprogramming the FPGA's as filter requirements change is also difficult. In addition, a unique design is required to interface to different processors or ADC's. The growth of remote, battery operated, sensor signal processing has exacerbated the problems.

Today's digital filtering requirements need a high-performance, easily programmable digital filter in a small, minimum pin-count, low-power, low-cost, and easy to integrate device. This requires a simple serial interface structure adaptable to modern DSP, µP, and ADC interfaces and easy-to-program digital filtering hardware. Emphasis on battery powered applications requires significant power reduction in all these devices.

DRAWINGS

FIG. 3 demonstrates different configurations available by showing an analog-to-digital conversion system implementing embodiments inserted in the signal-processing chain between ADC's with different serial interfaces and a µP/DSP, and as used in a coprocessor mode. It also demonstrates how multiple such systems can be used for serial filters.

Figure 4:
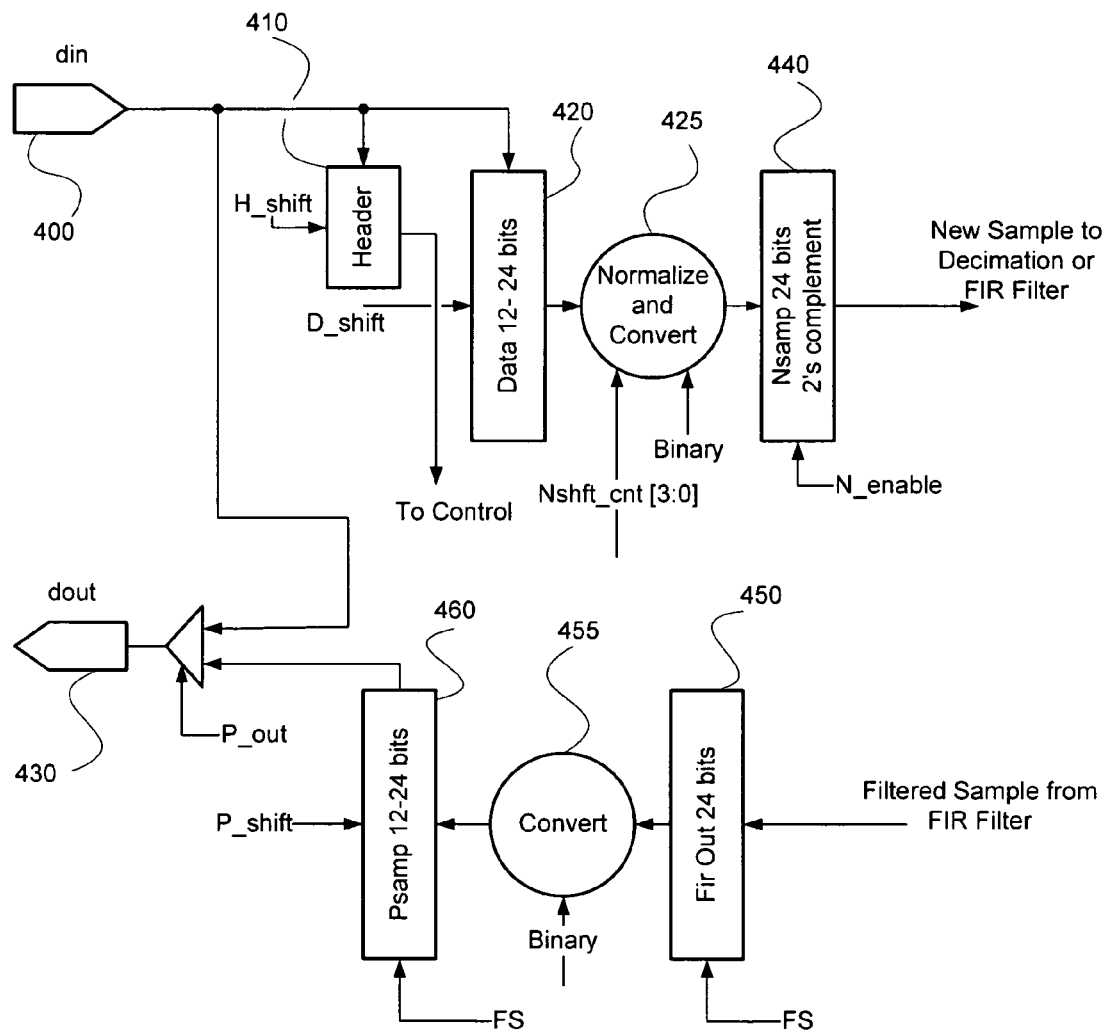

FIG. 4 illustrates the circuit of the sample-capture data path.

FIG. 5 illustrates the control logic for sample-capture circuit

Figure 6:
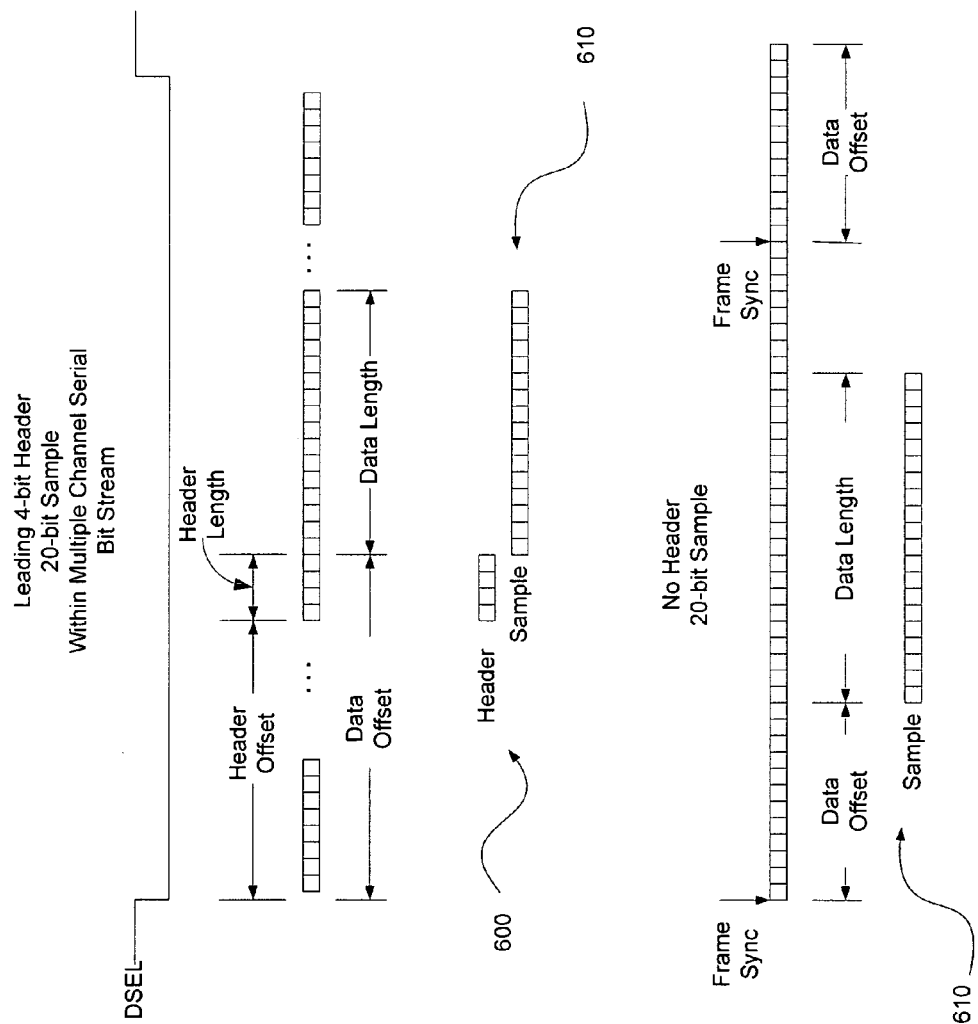

FIG. 6 illustrates how the data to be processed is extracted from serial bit streams.

Figure 7:
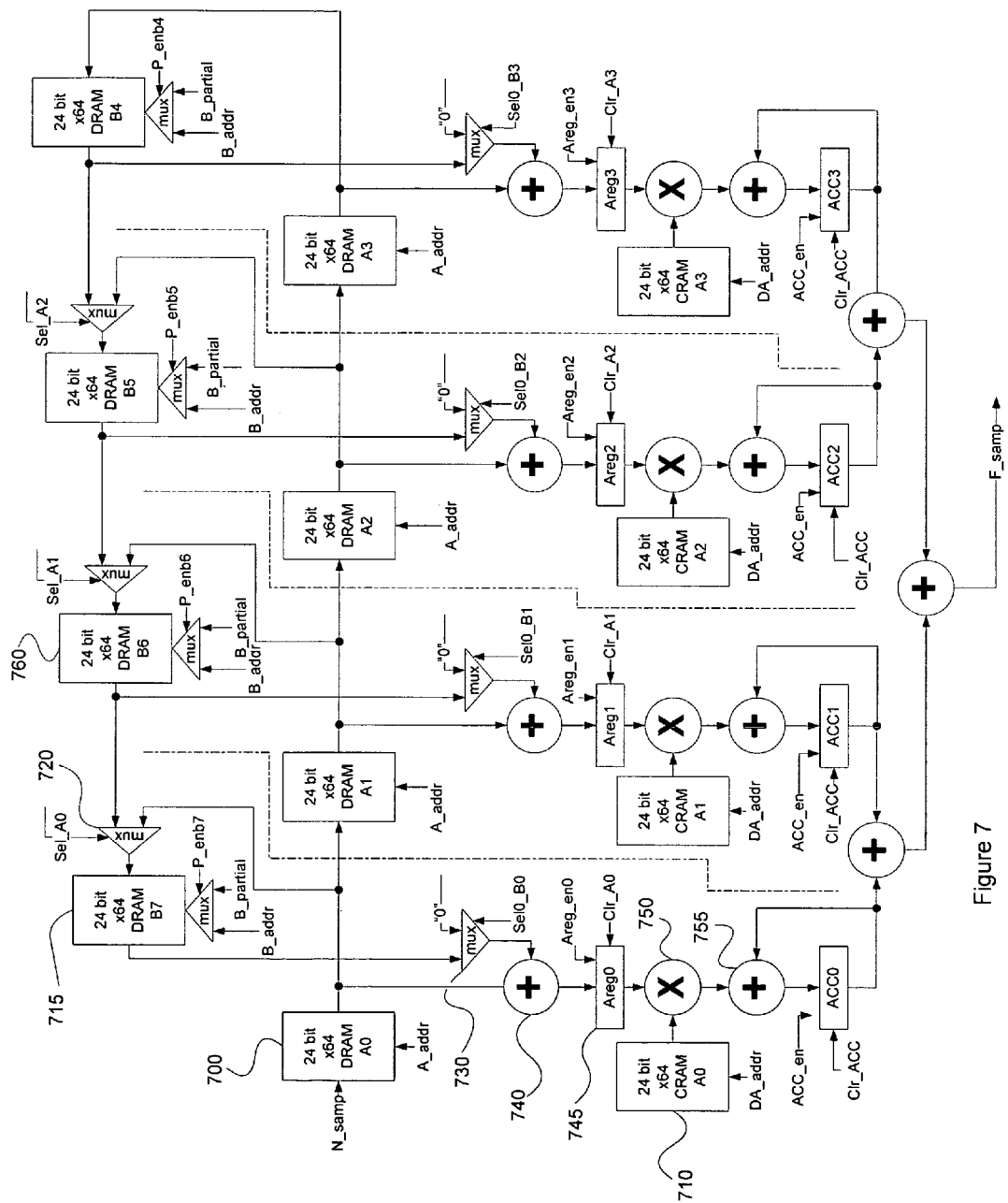

FIG. 7 shows the circuit of the FIR filter data path.

Figure 8:
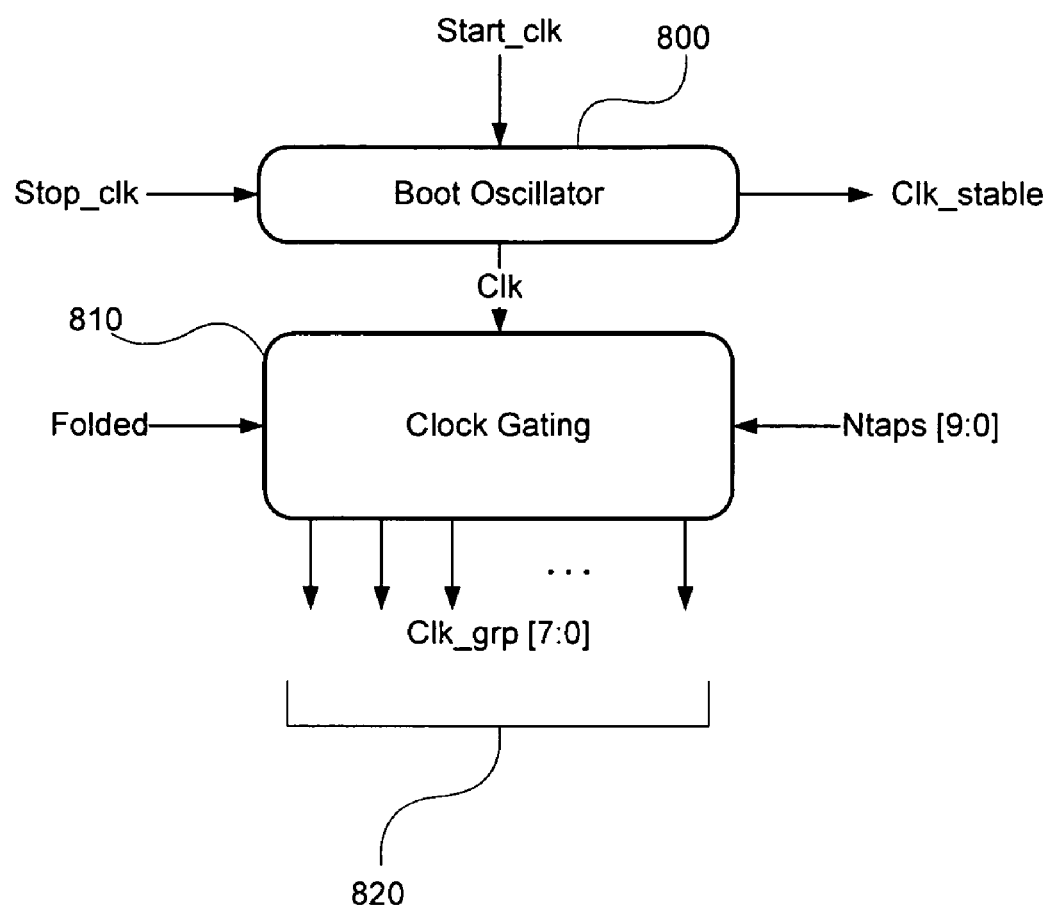

FIG. 8 shows clock generation for the FIR filter circuit.

Figure 9:
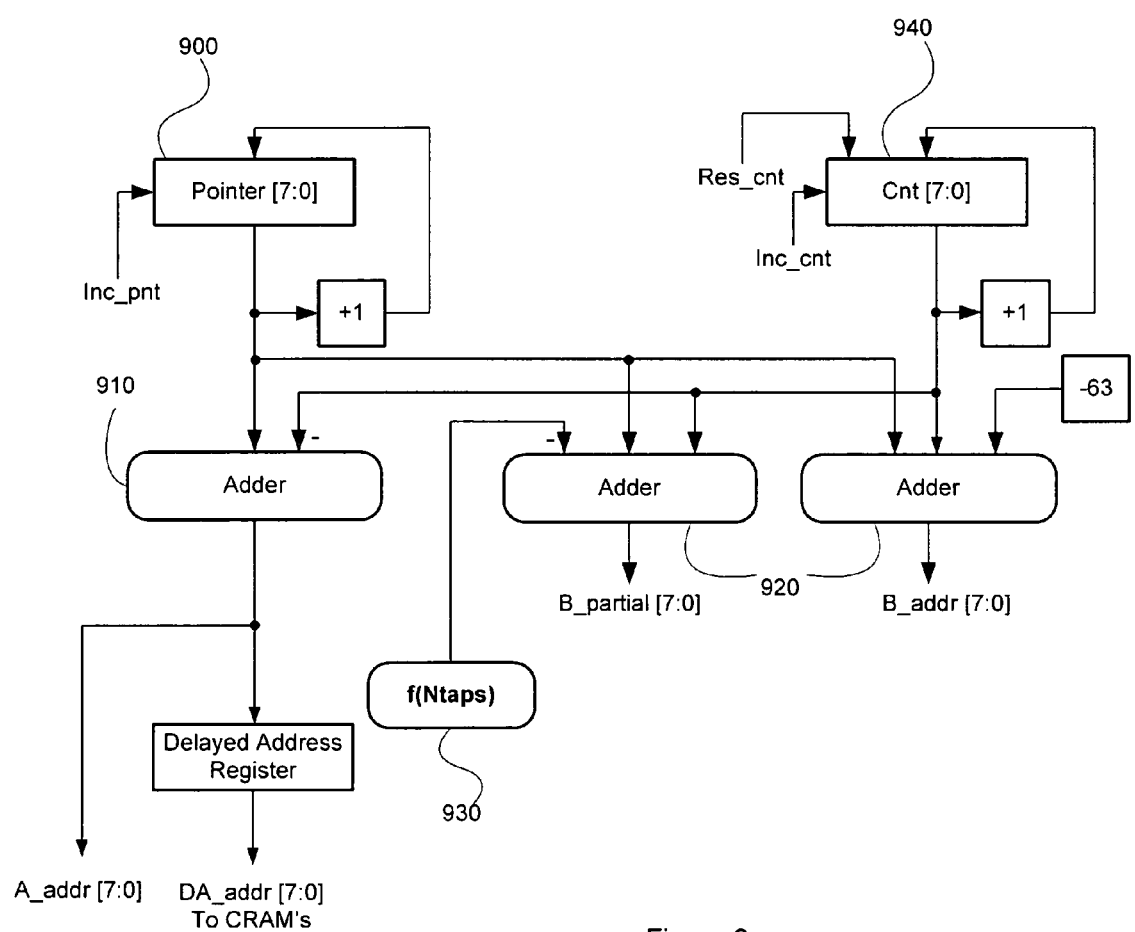

FIG. 9 illustrates the address generation for the FIR filter circuit.

FIG. 10 defines the FIR filter circuit control functions.

Figure 11:
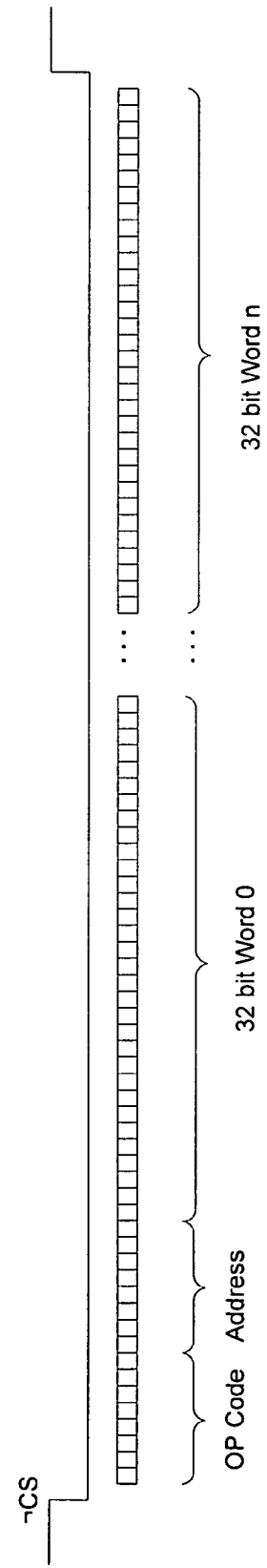

FIG. 11 shows the bit-stream protocol for configuration download in the preferred embodiment.

Figure 12:
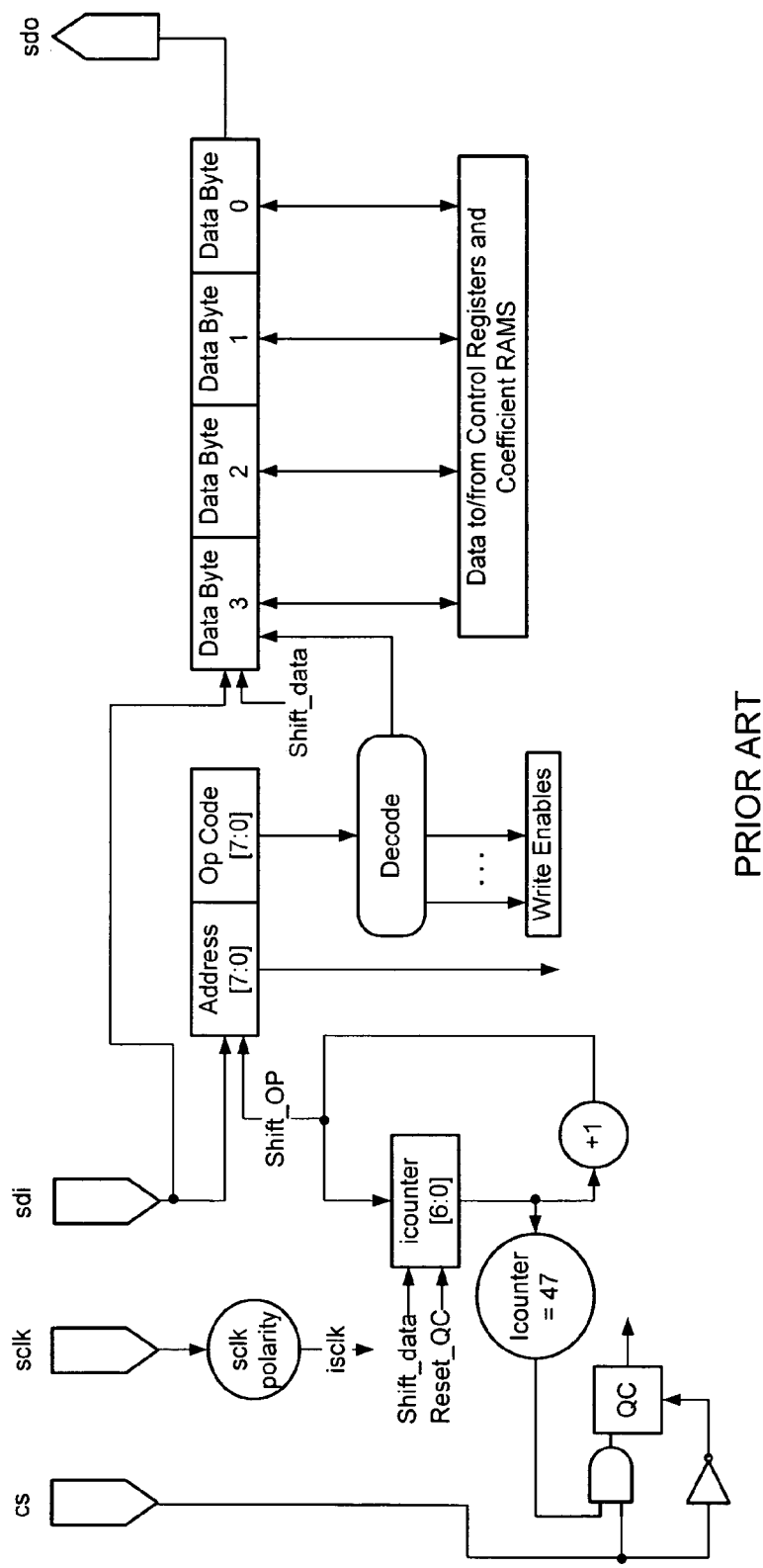

FIG. 12 illustrates a standard Serial Peripheral Interface (SPI) protocol used to initialize the device of the preferred embodiment with control parameters for a specific application. FIG. 12 is provided merely to assist the reader in understanding a typical physical interface for the claimed improvements.

DETAILED DESCRIPTION

We disclose a programmable digital filter system adaptable to both standard and many non-standard serial interfaces for transparent insertion into a signal processing data path that computes both linear and non-linear finite-impulse response filters. The typical application would insert the system between the ADC and the DSP or µP of a larger data-processing system, or use the system as an attached processor on the DSP or µP serial peripheral interface port, thus forming a complete analog-to-digital conversion system. The filtering of the data samples from the ADC is transparent to the processor because the processor sees the filtered data samples in the native format of the ADC. The preferred embodiment is a low pin count, low power integrated circuit readily programmed for FIR filter execution and with programmable interface and protocol structures to adapt to a wide selection of ADC's and DSP or µP serial bus interfaces. The system is designed for minimum power by controlling clocks and power distribution to only power resources used in a specific application.

Overview

Figure 1:
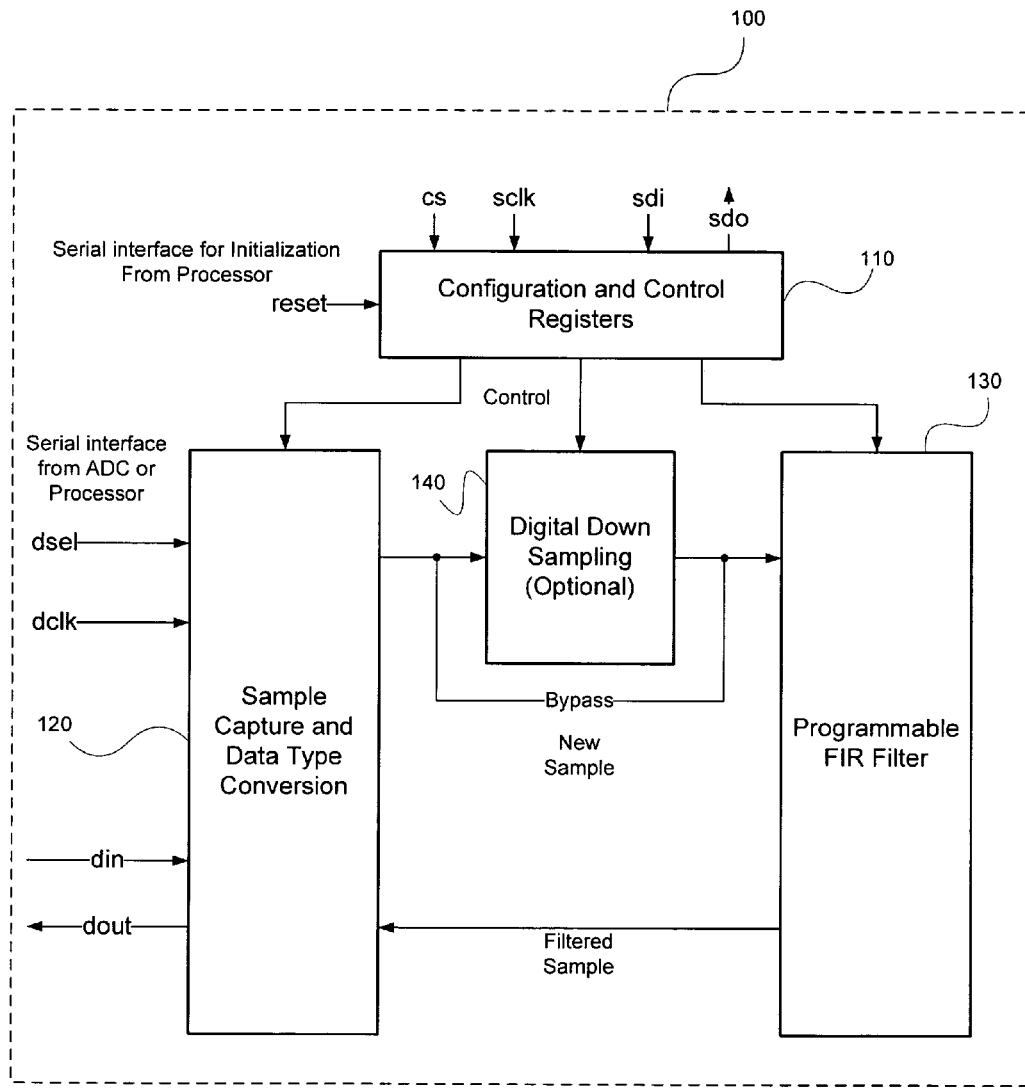
FIG. 1 shows an overall block diagram of the preferred embodiment of the digital-filter system.

FIG. 1 shows a block diagram of the preferred embodiment of the digital filter system (100). The configuration and control registers circuit (110) is used to initialize the system (100) with coefficients for the filter to be executed, and the control parameters to correctly interpret the interface signals from an ADC and the DSP or µP, and extract the input sample from the serial bit stream output by the ADC. Table 1 below defines these control parameters used to configure the system (100) for the chosen ADC and filtering application in the preferred embodiment.

TABLE 1

Control Registers

| Address (hex) | Bit 7 | Bit 6 | Bit 5 | Bit 4 | Bit 3 | Bit 2 | Bit 1 | Bit 0 |
|---|---|---|---|---|---|---|---|---|
| 0 | | | | | | | | Run |
| 1 | | Folded FIR | Serial Mode [1] | Serial Mode [0] | Binary Data Format | Dsel polarity | Dclk polarity | Sclk polarity |
| 2 | | | | Reserved for Downsampling | | | | |
| 3 | | | | Reserved for Downsampling | | | | |
| 4 | | | | | | | Ntaps [9:8] | |
| 5 | | | | Ntaps [7:0] | | | | |
| 6 | | | | Header offset [7:0] | | | | |
| 7 | | | | | Header length [3:0] | | | |
| 8 | | | | Header mask [7:0] | | | | |
| 9 | | | | Header value [7:0] | | | | |
| A | | | | Data offset [7:0] | | | | |
| B | | | | | Data Length [4:0] | | | |

The configuration and control registers circuit (110) extracts an operation code, an address, and data from the input serial bit stream and stores the data in the appropriate control register or coefficient memory. Note that other embodiments could use control registers of differing size and layout, but accomplishing the same function of storing configuration and control information in the system.

The sample-capture and data type conversion circuit (120) in FIG. 1 connects to the ADC or processor or both, and will have signals are adaptable to various serial interface ADC's, such as the ADS1255, manufactured by Texas Instruments, Inc., the 4-channel ADS8341 from Burr Brown/Texas Instruments, and the 2-channel CS5340/41-series converters from Cirrus Logic, Inc.

SPI is a serial interface standard established by Motorola, Inc. (now Freescale Semiconductor, Inc.) and is supported in silicon products by several manufacturers. In embodiments here, the SPI signals are only exemplary. Different embodiments could support other serial protocols for communication with ADC's, such as I2C; a two-wire interface where the master and slave share the same data line, and the chip select is embedded in the addressing; CAN, another two-wire protocol used in industrial and automotive applications; LVDS, a protocol using high speed differential serial signals, and others known in the art. The only change required would be a different physical interface to the operational portions of the circuits disclosed here, but the internal processing would be essentially the same.

The sample-capture and data type conversion circuit (120) counts input clocks from the ADC and extracts a header (if any), and a data sample to be filtered. The circuit (120) then converts the sample to a 2's complement format, and aligns the most-significant bit (MSB) of the sample to the MSB of the sample passed to the programmable-FIR filter circuit (130) for filtering. Simultaneously, a returning sample from the FIR filter circuit (130) is converted back to the data type and length of the input sample for transmission to the processor or another device.

The digital-down sampling (DDS) circuit (140) shown in FIG. 1 is an option that may be used to reduce the input sample rate to a lower rate. This is useful for performing multi-rate FIR's or averaging a higher sample rate to increase the resolution of an ADC. Implementation of digital down-sampling is well known in the art. A simple instance would be a design that merely discards all but one of n samples to reduce the effective sample rate of an oversampled ADC. Or it could be a "box car" averaging filter that outputs one sample of n input samples with a value equal to the average of the n input samples. Another often used approach is a CIC filter followed by a half-band filter for anti-aliasing. Any of these decimating designs would allow the described system to be serially connected to perform multi-rate filters.

Figure 2:
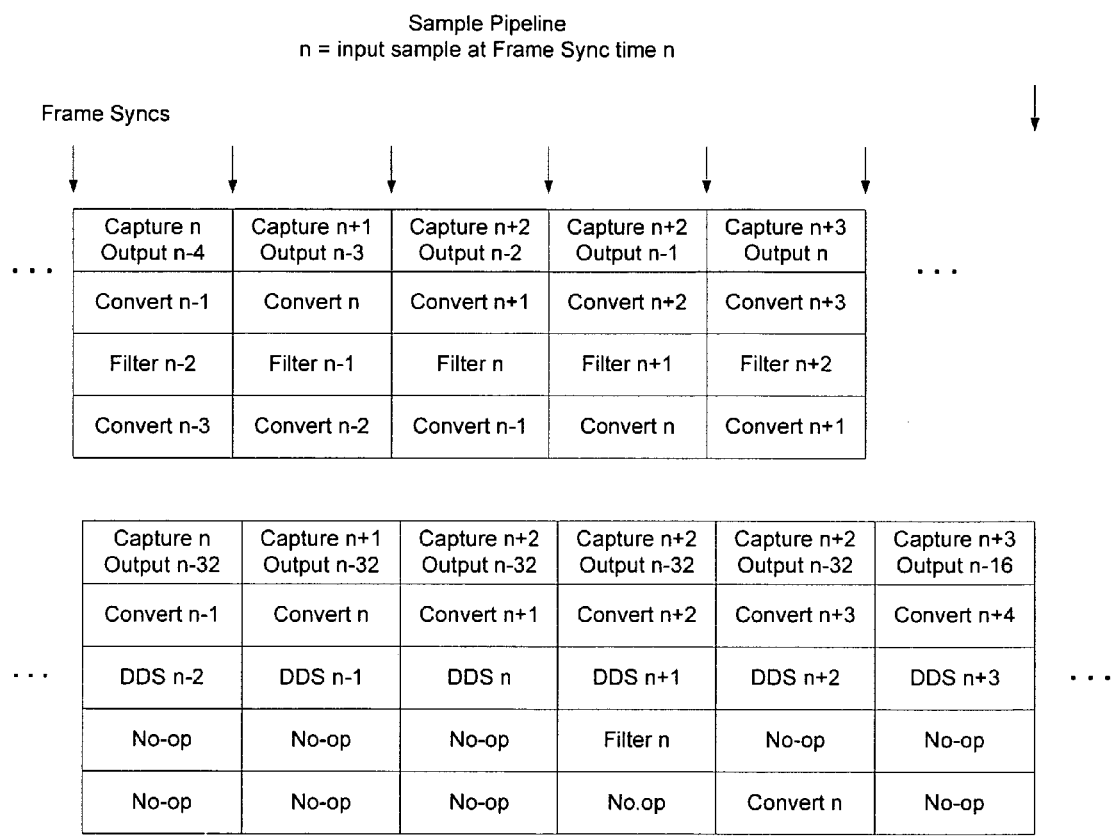
FIG. 2 shows the pipelined operation of a system implementing the preferred embodiment based upon a stream of input samples from the ADC.
Figure 3A:
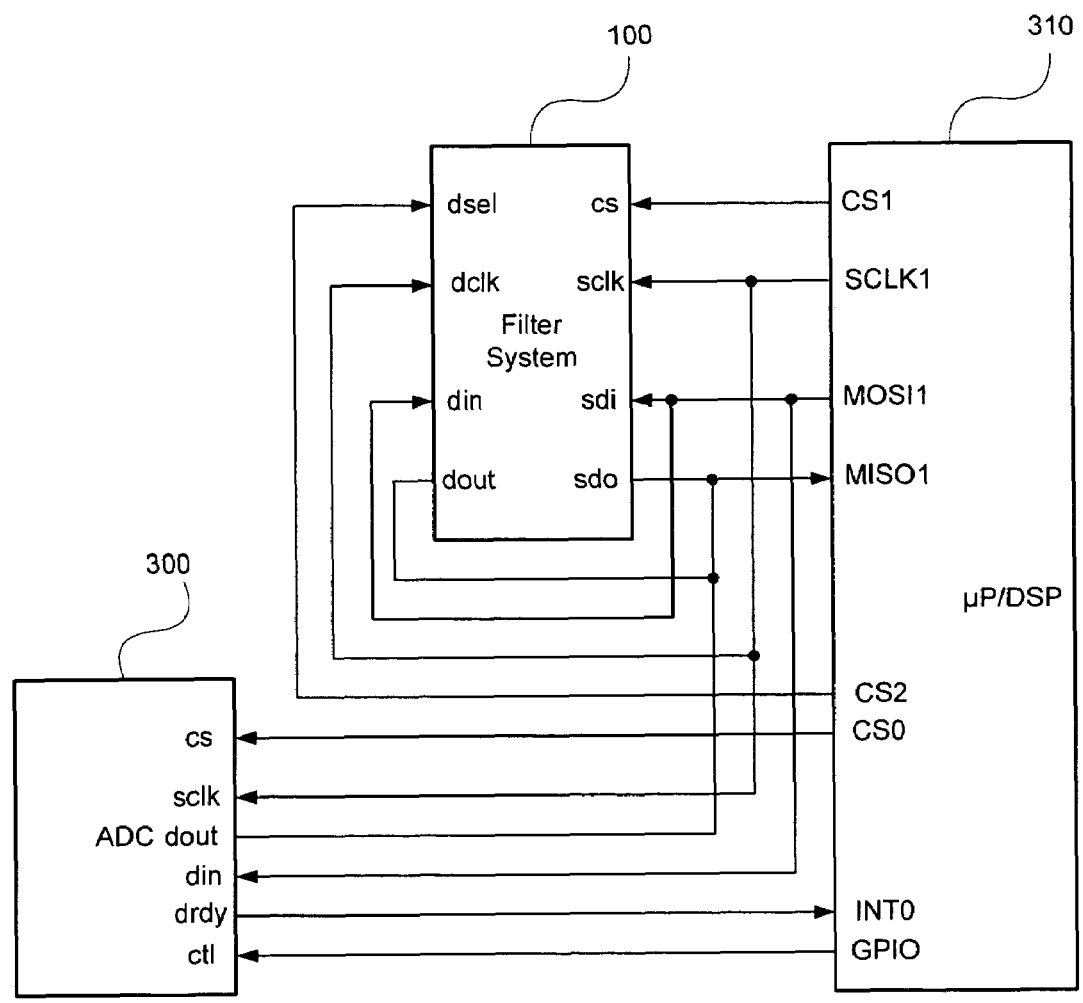
Figure 3B:
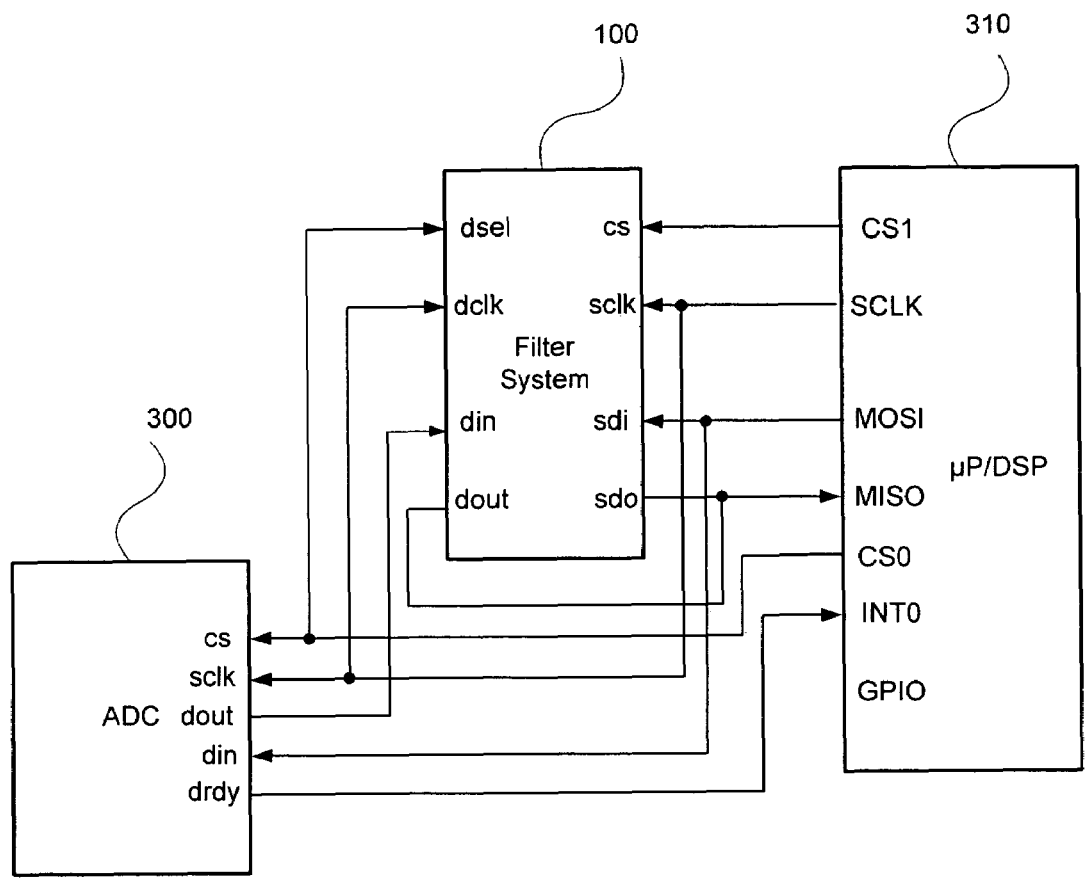
Figure 3C:
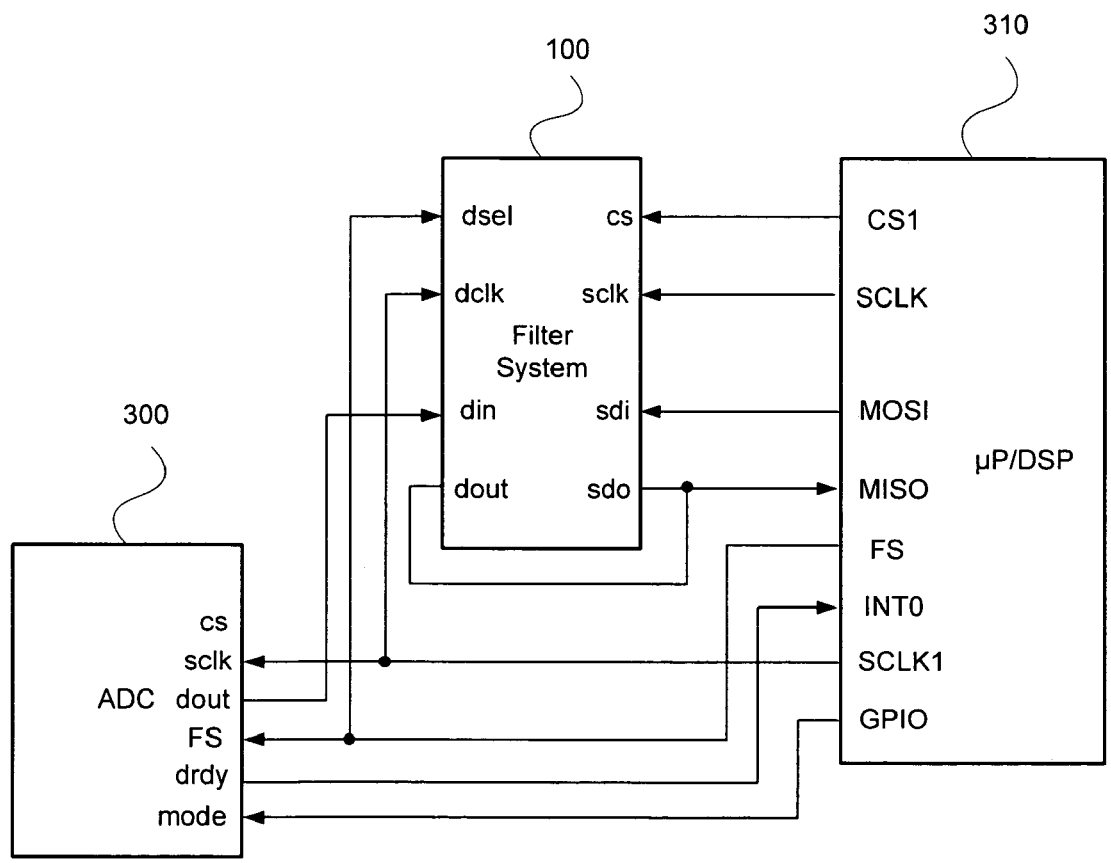
Figure 3D:
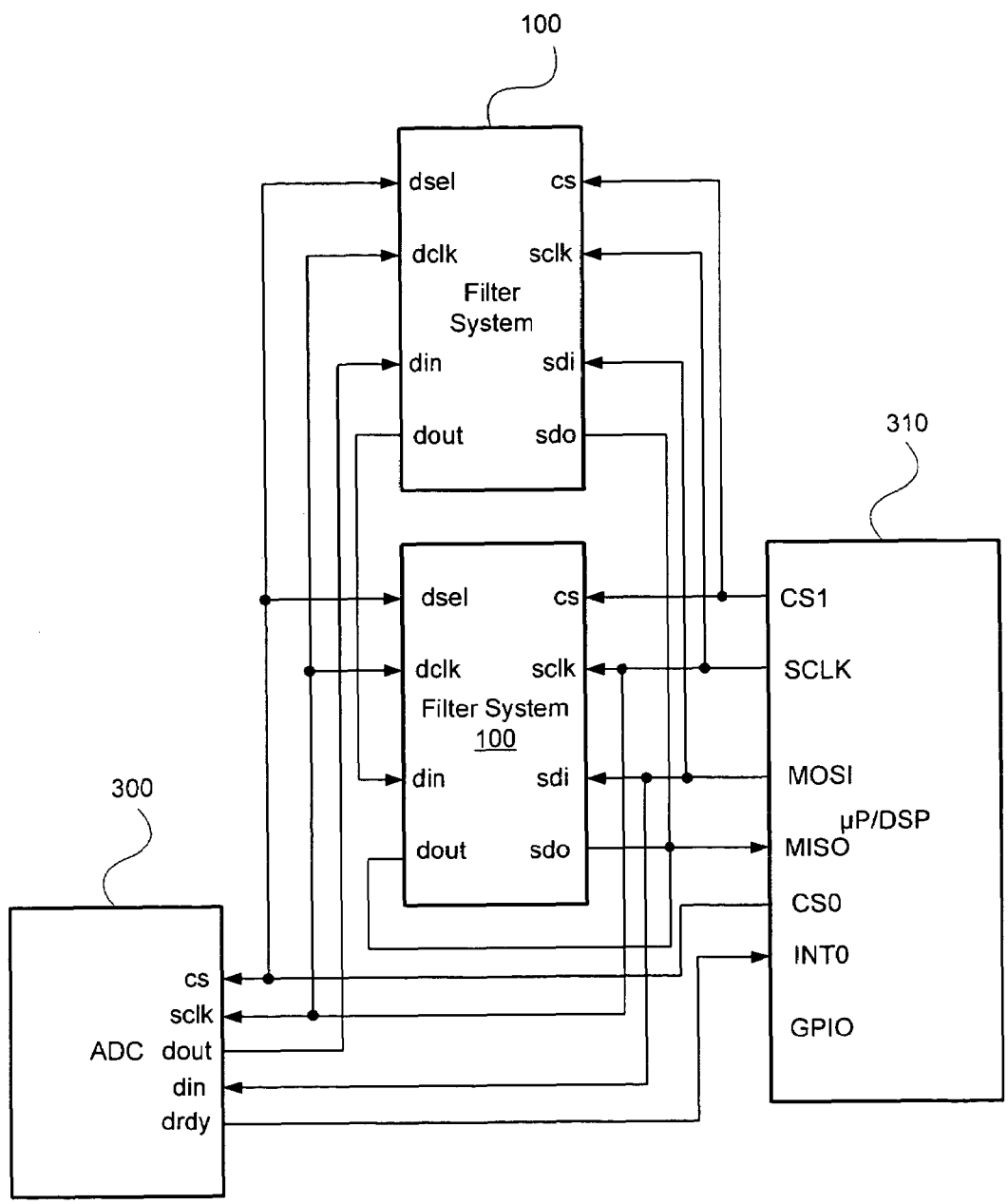

The resulting pipelined operation of the system (100) is illustrated in FIG. 2 with and without down sampling. Notice that the latency of the filter is four sample times from input to output. The pipeline movement is controlled by a frame-sync signal (described below) designating each sample. The frame-sync sample is generated externally or internally, dependent upon the mode of operation of the ADC (300).

FIG. 3 illustrates the connection of an ADC (300), the filtering system (100), and a processor (310) for different modes of operation in different embodiments of the system. FIG. 3a shows the coprocessor configuration, where the processor (310) sends input samples to the filter (100) and receives filtered samples back; FIG. 3b shows the system (100) filtering samples from an ADC (300), which are then captured by a processor (310); FIG. 3c illustrates a "serial synchronous" connection where samples are designated by a frame-sync pulse from the processor (310) to the ADC (300) and filter (100); and FIG. 3d illustrates the connections for connecting two filters (100) in series between the ADC (300) and the processor (310) for multi-rate filtering or the filtering of multiple channels.

Sample-Capture and Data-Type Conversion Circuit

FIG. 4 illustrates the data path of the sample-capture and data-type conversion circuit (110). FIG. 5 shows control resources for this bloc (110).

Referring to Table 1 above, the control registers pertinent to the sample-capture and data-type circuit (110) include the serial-interface mode bits [1:0] which define the serial interface mode, The binary-data format bit that indicates offset-binary sample format (versus 2's complement), and the data-select (dsel) and data-clock (dclk) polarity bits that define the leading edge versus trailing edge interpretation of these inputs. The header offset, header length, header mask, header value, data offset, and data length registers are used to extract the header (if any) and data from the serial input stream, and, using the header mask and value, determine if the sample is to be processed by this particular device. This permits the system to select one channel's sample for filtering, out of several channels in the serial stream. In this disclosure, the din signal refers to data-in to either the ADC (300) or the processor (310) as the context requires.

As shown in FIGS. 4 and 5, once placed in operation by a frame sync pulse, the signal-capture and data-type circuit (110) shifts the input serial stream data-in (400) through the header (410) and data (420) shift registers, as well as to the data-out (430) pin. The input counter (590), shown at FIG. 5c, counts these input bits and sets its reset (IC_reset) and count-active (IC_cnt) lines. When the count is equal to the header offset plus the header length, the controller (controller functions are shown in FIG. 5) freezes the header register (410) until the next frame sync. The data register (420) is frozen when the count reaches a value equal to the data offset plus the data-length value.

If there is no header, the data sample is simply replaced by the prior sample. On the next frame sync, the captured sample, if any, is transferred to the new sample register (Nsamp) (440) after being normalized and converted to a 2's complement, 24-bit number. This transition starts the FIR filter process, or, if enabled, the optional DDS process first. The 24-bit data length of the illustrated embodiment is chosen since most current serial-output ADC's have resolutions ranging from 12 to 24 bits, although other embodiments could have a different data length.

The normalize-and-convert function (425) normalizes the input data. If the input data is less than 24 bits, the data must be left-shifted to place the most significant bit (MSB) in the MSB of the 24-bit Nsamp register, according to values in the control registers (see Table 1), as follows:

NShft_cnt[3:0]=24−Data length[7:0]

Shift left by NSft_cnt [3:0];

The data is converted on input according to Binary [3:1]:
If Binary=1, invert bits and add 1, And on the output, according to Binary [3:1]:
If Binary=1, invert MSB At each frame sync, the sample in the accumulator of the FIR is transferred to the FIR output register (450), where it is converted back to the original data format and length of the input sample, and placed in the prior-sample register (Psamp) (460) for transfer to the output data stream (din to the processor (310)). The transfer occurs when the data-length count is complete, as shown by the condition that the captured header, masked by the header-mask register, is equal to the header-register (410) contents.

FIG. 5 illustrates control resources for controlling the described operations. The logic runs on the input-data clock (dclk) (500). As shown in FIG. 5a, the frame sync is generated from the data-select (dsel) (510) input and the mode-control bits. For an SPI mode device, for example, in mode 0, dsel (510) acts as a chip select and the frame sync is generated on the first dclk after dsel goes active; for the SPI continuous mode, mode 1, the clock may be continuous and dsel may be tied active. In the latter case, the frame sync is generated by completion of a data transfer. For SPI synchronous mode, mode 2, the frame sync is generated externally and applied to the dsel input (510). (The reader should recall that other physical interfaces besides SPI can easily be adapted, so the use of SPI modes below is only exemplary). The logic equations for frame sync FS (550) and iclk clock generation (520, 530) in the embodiment of FIG. 5a is:

isel=dsel·dsel polarity+¬dsel·¬dsel polarity iclk=dclk·dclk polarity+¬dclk·¬dclk polarity FS=SPI Mode[1]·isel+¬SPI Mode[1]·SPI Mode[0]\

·Data Complete+¬SPI Mode[1]·¬SPI Mode[0]·isel·¬QFSEL

Where the QFSEL signal is the output of an asynchronous latch (540), and,

Set QFSEL=isel·iclk

Reset QFSEL=¬isel

FIG. 5b is a state diagram for the system, where:
QActive indicates the input controller is active; and,
QNew indicates a valid data sample is in the 24 bit, 2's complement
Nsamp register.
On these flags, the state of the system changes from IDLE (560) to ACTIVE (570), to ACTIVE/NEW (580).

The control logic equations are:

Header Complete=Input counter[7:0]≥SUM{Header offset[7:0]; \

Header length[3:0]; −1}

Offset Complete=Input counter[7:0]≥SUM{Data offset[7:0]; −1}

Data Complete=Input counter[7:0]={Data offset[7:0]; Data length[7:0]; −1}

Data Valid={Header[7:0]·Header mask[7:0]=Header value[7:0]}

IC_cnt=QACT·{¬(Data Complete)+¬(Header Complete)}

IC_reset=QACT·FS·Header Complete·Data Complete

H_shift=¬(Header Complete)

D_shift=¬(Data Complete)

P_shift=P_out=Data Valid·¬(Data Complete)·Offset Complete

N_enable=IC_reset·Data Valid

FSF=N_enable·iclk(the frame sync signal to the FIR filter circuit)

FIG. 6 shows how the header and sample data are extracted from the multi-bit input data stream for both an input with (600) and without (610) a header.

FIR Filter Circuit

The FIR filter (130) data path is shown by the circuit in FIG. 7. Note that the logic is partitioned into four separate but identical sub-circuits. The embodiment described performs up to 512-tap linear FIR filters and 256-tap non-linear FIR filters; however it is expandable to larger tap counts by adding more sub-circuit banks or larger data and coefficient memories. Notice that each sub-circuit executes read-two operands, add, multiply, and accumulate functions for folded (symmetric) FIR filters, and read-data, multiply and accumulate functions for non-linear FIR's. (Non-symmetric FIR's do not use the B data memories.) As shown in FIG. 7, each sub-circuit has a data RAM (700), a coefficient RAM (710) and a "B" data RAM (715) for folded FIR filters.

FIG. 7, in each sub-circuit, a first multiplexer (720) selects the oldest sample in DRAM A0 (700) for transfer to DRAM B7 (715) when a new sample is input to DRAM A0 (700), just before processing a new filtered sample output for linear filters of less than or equal to 128 taps, or selecting the oldest sample from DRAM B6 (760) for filters of greater than 128 taps. A second multiplexer (730) selects the output of DRAM B7 (715) for linear filters (folded) or a logic zero for non-linear filters to an adder (740) that adds this selection to the current output of DRAM A0 (700), and a third multiplexer (740) selects the full address (B_addr) generated for DRAM B0 if the tap count is greater than 128 for linear FIR's or the partial address (B_partial) if the tap count is less than 128. A pipeline register (745) receives the sum (740) of the data sample and the output of second multiplexer (730). Multiply and accumulate operations (750, 755) on the data sample and coefficients is then performed, according to the usual operation of digital filter algorithms.

The filter circuit (130) runs on an internally generated clock (iclk) that is started asynchronously when a new sample for processing appears in the new sample (Nsamp) register (440) and is turned off when the process completes. FIG. 8 defines the clock generation and fanout of clocks only to those resources used for the particular filter for power savings for shorter filters. These same clock enable functions (810) can be used to enable or disable power to the partitioned logic circuits for further power savings. The boot oscillator (800) is a standard function in modern semiconductor devices. Its clock rate must be fast enough to complete a 512-tap linear or 256-tap non-linear filter at the input sample rate.

The Clk_grp[7:0] lines (820) control the registers in the respective sub-circuits or banks of FIR filtering shown in FIG. 7, so that only the groups required for the number of taps specified are enabled, thus saving power. The logic equations for filter circuit bank selection are set out above. FIG. 7 shows four banks each capable of handling a filter of 64 taps each. The reader will see that the concept may be easily extended for additional banks to accommodate filters with a greater number of total taps. In another embodiment, the clock may be started and stopped only for the number of cycles necessary for the filtering calculation.

The logic equations for the boot oscillator (800) and Clk_grp (820) signals shown in FIG. 8 are:

Boot Oscillator Control:

Start_clk=N_enable·iclk(from Capture block)

Stop_clk=QCLR·$\overline{\text{QPIPE2}}$(from FIR control)

Clk_grp [7:0] Assignments and Clock Gating:

Clk_grp(0):DRAM A0, CRAM A0, Areg0, ACC0

Clk_grp(1):DRAM A1, CRAM A1, Areg1, ACC1

Clk_grp(2):DRAM A2, CRAM A2, Areg2, ACC2

Clk_grp(3):DRAM A3, CRAM A3, Areg3, ACC3

Clk_grp(4):DRAM B4

Clk_grp(5):DRAM B5

Clk_grp(6):DRAM B6

Clk_grp(7):DRAM B7

Clk_grp [7:0] Logic:

Clk_grp(7)=Clk·Folded

Clk_grp(6)=Clk·Folded·[(Ntaps[9:0]+1)>128]

Clk_grp(5)=Clk·Folded·[(Ntaps[9:0]+1)>256]

Clk_grp(4)=Clk·Folded·[(Ntaps[9:0]+1)>384]

Clk_grp(3)=Clk_grp(4)+Clk·$\overline{\text{Folded}}$·[(Ntaps[9:0]+1)>192]

Clk_grp(2)=Clk_grp(5)+Clk·$\overline{\text{Folded}}$·[(Ntaps[9:0]+1)>128]

Clk_grp(1)=Clk_grp(6)+Clk·$\overline{\text{Folded}}$·[(Ntaps[9:0]+1)>64]

Clk_grp(0)=Clk]

Note that the filter (130) of the illustrated embodiment always processes all taps in 64 clocks plus the clocks required to fill and empty the pipeline. For filters (130) whose numbers of taps are not even increments of 64, the pipeline is controlled to insert zeroes into the multiplication. At the completion of sample processing, the result remains in the accumulator registers of the filter (130) until the next sample begins processing.

The FIR address control functions are shown in FIG. 9. These pointers (900) and address counters (910, 920) use 2's complement arithmetic. Thus the numbers (without the sign bit) wrap around when reaching their limits. The A address counter (910) increments forward and the B address counter (920) decrements backward from 63; thus the two operands added in a folded FIR are always the newest plus the oldest, next newest plus next oldest etc. The f(Ntaps) register (930) is used to determine when the filter length has completed in order to zero further multiplies in the partition with a partially filled memory where the number of taps is not an even multiple of 64. Note that the A address is delayed to match the fetch of coefficients to the pipeline delay of the add function. For this design example, it is assumed that each memory has an address register and a data-output register, thus the pipeline stages include the address counter and address pointer, the memory address register, the memory output register, the add register, and the accumulator registers.

Figure 10A:
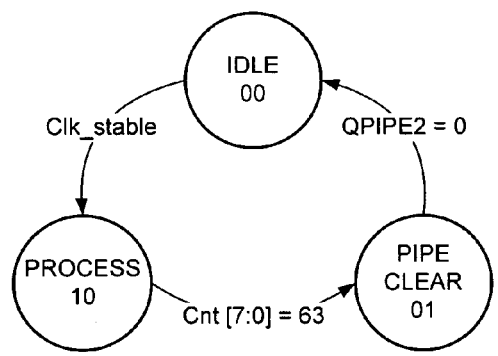
Figure 10B:
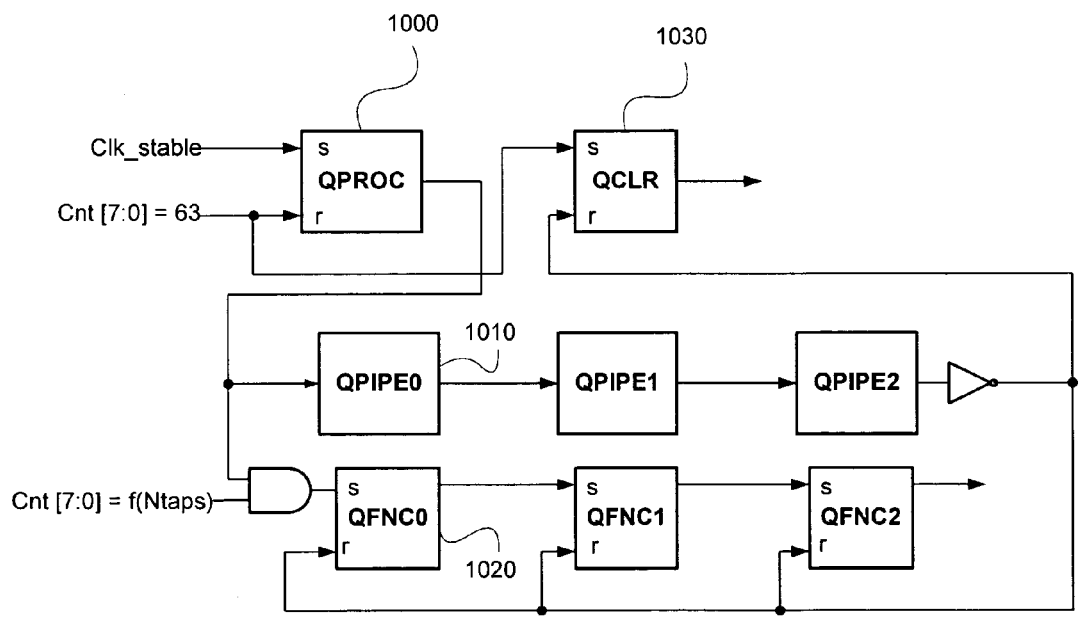

FIG. 10*a* defines the control states required to control the pipelined function. In FIG. 10*b*, QPIPE0 through QPIPE2 (1010) are pipeline delay registers used to enable the registers shown in FIG. 7 at the correct time at start-up, thereby keeping zeroes in the registers until filled with new data. QFNC0 through QFNC2 (1020) are pipeline delay registers that clear the FIG. 7 registers as the pipeline drains at completion of FIR processing. The output of the QCLR flip-flop (1030) is used in the generation of the Write_enable signal, as shown below. The following logic equations define a typical implementation of control logic for computing the FIR function:

Static Control Signals (Configuration):

Sel_A0=Folded·(Ntaps[9:0]≦128)+(Ntaps[9:0]≦64)

Sel_A1=Folded·(Ntaps[9:0]≦256)+(Ntaps[9:0]≦128)

Sel_A2=Folded·(Ntaps[9:0]≦384)+(Ntaps[9:0]≦192)

Sel_A3=Folded·(Ntaps[9:0]≦512)+(Ntaps[9:0]≦256)

P_enb7=Folded·Sel_A0

P_enb6=Folded·Sel_A1

P_enb5=Folded·Sel_A2

P_enb4=Folded·Sel_A3

Dynamic Control Signals (Operating):

Sel0_B0=QFNC1·Ntaps(0)·Sel_A0

Sel0_B1=QFNC1·Ntaps(0)·Sel_A1

Sel0_B2=QFNC1·Ntaps(0)·Sel_A2

Sel0_B3=QFNC1·Ntaps(0)·Sel_A3

Areg_en0=QPIPE1·¬Clr_A0

Areg_en1=QPIPE1·¬Clr_A1

Areg_en2=QPIPE1·¬Clr_A2

Areg_en3=QPIPE1·¬Clr_A3

Clr_A0=QPIPE1·QFNC2·Sel_A0

Clr_A1=QPIPE1·QFNC2·Sel_A1

Clr_A2=QPIPE1·QFNC2·Sel_A2

Clr_A3=QPIPE1·QFNC2·Sel_A3

ACC_en=QPIPE2

Clr_ACC=QPIPE1·¬QPIPE2

Inc_pnt=QPROC·(Cnt[7:0]=63)

Inc_cnt=QPROC·¬(Cnt[7:0]=63)

Res_cnt=Inc_pnt

Write_enable=¬QPROC·¬QCLR·Clk_stable(to A & B DRAMS)

Summarizing, when the clock is stable at the QPROC flip-flop (1000), the new sample is written into the current address, and the pipeline registers (1010) are cleared when the QCLR flip-flop (1020) is set. Then the operand fetches are started and the address counters proceed through 64 fetches; the pipeline (1010) is then drained to complete the accumulation; the pointer (900) is updated and the counter (940) is reset. The clock is then turned off to await the next sample. When the new operand is stored at the A address (910), the oldest operand in each memory is moved to replace the oldest operand in the next sequential memory; thus the pointers (900) are always positioned to address the newest sample in the A memories (700, 710) and the oldest sample in the B memories (715) at the start of filter processing. The f(Ntaps) signal is generated from the following logic equation:

f(Ntaps)=Folded·(Ntaps[9:0]+1)/2+¬Folded·(Ntaps[9:0]+1).

Configuration and Control Registers Circuit

FIG. 11 shows the input bit stream on the serial-interface port used to download configuration data to the system as detailed in Table 1. FIG. 12 shows the details of the configuration and control registers circuit (110) for the exemplary SPI interface. The processor (310) initiates the download by asserting chip select (cs) and clocking serial data into the system (100) with the serial clock (sclk) and serial data in (sdi) signals. The operations code is the first eight bits received, followed by the register or coefficient memory address, and the data to be downloaded—eight bits for each register or 32 bits for each coefficient. The configuration circuit (110) preferably has an automatic address increment function for downloading (or reading) a continuous stream of data. A read command shifts out the addressed register or coefficient memory contents via the serial data out (sdo) signal following the input of the operation code and the register or memory address. The configuration circuit is not shown in further detail, since a standard SPI port interface can be used with FIG. 11's defined protocol, or other serial or parallel interfaces could be used.

We claim:

1. A digital filter system comprising:
   a circuit for sample collection and data-type conversion;
   an FIR filter circuit connected to receive data from, and output filtered data to, the sample capture and data-type conversion circuit;
   the FIR filter circuit being selectively programmable for the parameters of a pre-determined digital-filter function;
   a configuration and control-register circuit operatively connected to the circuit for sample collection and data-type conversion and to the FIR filter circuit, for selectively controlling the operation of the digital filter system.

2. The digital filter system of claim 1, where the circuit for sample collection and data-type conversion further comprises:
   a plurality of registers for holding control parameters for a pre-selected analog-to-digital converter;
   a header shift register for header information from an output stream of a pre-selected analog-to-digital converter;
   a data shift register for sample data from an output stream of a pre-selected analog-to-digital converter;
   a counter register operatively connected to the first and data shift registers for counting the number of bits shifted into the header shift register and the data shift register;
   a circuit connected to the data shift register for converting and normalizing sample data for input to a digital filter circuit; and,
   a circuit connected to the digital filter circuit for converting filtered sample data to the format of the pre-selected analog-to-digital converter.

3. The digital filter system of claim 1 where the sample collection and data-conversion circuit is selectively programmable to accept the sample data format of a pre-selected analog-to-digital converter.

4. An analog-to-digital conversion system comprising:
   an analog-to-digital converter;
   a digital-filter system;

the digital-filter system connected to the output of the analog-to-digital converter;

a circuit for sample collection and data-type conversion;

an FIR filter circuit connected to receive data from, and output filtered data to, the sample capture and data-type conversion circuit;

a configuration and control-register circuit operatively connected to the circuit for sample collection and data-type conversion and to the FIR filter circuit, for selectively controlling the operation of the digital filter system;

a processor;

the processor connected to the output of the digital-filter system;

so that the processor receives filtered sample data in the native format of the analog-to-digital converter.

5. The analog-to-digital conversion system of claim 4, where the circuit for sample collection and data-type conversion further comprises:

a plurality of registers for holding control parameters for a pre-selected analog-to-digital converter;

a header shift register for header information from an output stream of a pre-selected analog-to-digital converter;

a data shift register for sample data from an output stream of a pre-selected analog-to-digital converter;

a counter register operatively connected to the first and data shift registers for counting the number of bits shifted into the header shift register and the data shift register;

a circuit connected to the data shift register for converting and normalizing sample data for input to a digital filter circuit; and, a circuit connected to the digital filter circuit for converting filtered sample data to the format of the pre-selected analog-to-digital converter.

6. The analog-to-digital conversion system of claim 5, where the circuit for sample collection and data-type conversion further comprises:

a header mask register for comparing a captured header value masked by a header mask value to the header shift register contents.

7. The analog-to-digital conversion system of claim 4 where the sample collection and data-conversion circuit is selectively programmable to accept the sample data format of a pre-selected analog-to-digital converter.

8. The analog-to-digital conversion system of claim 4 further comprising:

a digital down-sampling circuit connected between the circuit for sample collection and data-type conversion circuit and the FIR filter circuit.

9. The analog-to-digital conversion system of claim 4 where the FIR filter circuit is selectively programmable for the parameters of a pre-determined digital-filter function.

10. The analog-to-digital conversion system of claim 4, further comprising two or more digital filter systems connected in serial between the output of the analog-to-digital converter and the processor.

11. The analog-to-digital conversion system of claim 4, where:

the digital filter system is connected to the processor; and, the analog-to-digital converter is connected to the processor; so that the digital-filter system is a co-processor to the processor.

12. The analog-to-digital conversion system of claim 4 further comprising:

the processor have an output for a frame-sync signal to designate the beginning of a sample from the analog-to-digital converter; and, the processor connected to supply the frame-sync signal to the analog-to-digital converter and the digital-filter system to allow synchronous serial communication between the analog-to-digital converter and the digital-filter system.

13. A method of transparently inserting a digital-filter system in the signal chain of an analog-to-digital converter and processor, comprising the steps of:

programming a sample capture and data-type conversion circuit to capture data from a pre-selected analog-to-digital converter;

converting the sample data so captured to a binary format suitable for input to a digital filter;

normalizing the sample data so captured to a format suitable for input to a digital filter;

performing a filtering operation on the sample data in the digital filter;

converting the filtered sample data back to the data format of the pre-selected analog-to-digital converter; and, outputting the converted sample data to the input of a processor.

14. The method of claim 13, where the converting of the sample data captured to a binary format suitable for input to a digital filter comprises:

shifting data from the output stream of the analog-to-digital converter into a header shift register for header information;

shifting data from the output stream of the analog-to-digital converter into a data shift register for sample data;

counting the bits shifted into the header shift register and the data shift register respectively;

stopping the shifting of the header shift register when the count is equal to a pre-determined header offset plus header length; and, stopping the shifting of the data shift register when the count is equal to a pre-determined data offset plus data length.

15. An integrated circuit for performing the functions of a digital filter system comprising:

a circuit for sample collection and data-type conversion;

the sample collection and data-conversion circuit being selectively programmable to accept the sample data format of a pre-selected analog-to-digital converter;

an FIR filter circuit connected to receive data from, and output filtered data to, the sample capture and data-type conversion circuit;

a configuration and control-register circuit operatively connected to the circuit for sample collection and data-type conversion and to the FIR filter circuit, for selectively controlling the operation of the digital filter system.

16. The integrated circuit of claim 15, where the circuit for sample collection and data-type conversion further comprises:

a plurality of registers for holding control parameters for a pre-selected analog-to-digital converter;

a header shift register for header information from an output stream of a pre-selected analog-to-digital converter;

a data shift register for sample data from an output stream of a pre-selected analog-to-digital converter;

a counter register operatively connected to the first and data shift registers for counting the number of bits shifted into the header shift register and the data shift register;

a circuit connected to the data shift register for converting and normalizing sample data for input to a digital filter circuit; and, a circuit connected to the digital filter circuit for converting filtered sample data to the format of the pre-selected analog-to-digital converter.

17. The integrated circuit of claim 15 where the FIR filter circuit is selectively programmable for the parameters of a pre-determined digital-filter function.

18. A circuit for sample collection and data-type conversion within a digital-filter system comprising:

a plurality of registers for holding control parameters for a pre-selected analog-to-digital converter;

a header shift register for header information from an output stream of a pre-selected analog-to-digital converter;

a data shift register for sample data from an output stream of a pre-selected analog-to-digital converter;

a counter register operatively connected to the first and data shift registers for counting the number of bits shifted into the header shift register and the data shift register;

a circuit connected to the data shift register for converting and normalizing sample data for input to a digital filter circuit; and, a circuit connected to the digital filter circuit for converting filtered sample data to the format of the pre-selected analog-to-digital converter.

19. The circuit for sample collection and data-type conversion of claim 18, further comprising:

a header mask register for comparing a captured header value masked by a header mask value to the header shift register contents.

20. A digital-filter system comprising:

an FIR filter circuit connected to receive data from, and output filtered data to, a sample capture and data-type conversion circuit;

the FIR filter circuit further comprising:

at least two filter sub-circuits for performing digital-filtering calculations;

each of the at least two filter sub-circuits further comprising clocked registers for data and filter coefficients;

a clock-generation circuit connected to the clocked registers of the at least two filter sub-circuits;

the clocked registers of the at least two filter sub-circuits selectively enabled by the clock-generation circuit, corresponding to pre-determined values of filter-tap length, so as to only enable the number of the at least two filter sub-circuits required to perform digital-filtering calculations for the pre-determined filter-tap length.

21. The digital filter system of claim 20 where the number of filter sub-circuits is four.

22. The digital filter system of claim 20 where each filter sub-circuit permits calculation of 64-tap non-symmetric digital filters.

23. The digital filter system of claim 20 where each filter sub-circuit permits calculation of 128-tap symmetric digital filters.

24. The digital filter system of claim 20, where the clocked registers of each filter sub-circuit further comprise:

address registers; and, data registers, coefficient registers, and an accumulator register connected to the address registers.

25. The digital filter system of claim 20, where the clock-generation circuit further comprises:

a boot oscillator; and, a clock-gating circuit for selectively enabling clock lines to the filter sub-circuits according to the pre-determined filter tap length.

26. The digital-filter system of claim 20 where the clock generation circuit is selectively enabled only for the number of clock cycles sufficient to perform the filtering calculations for the pre-determined filter-tap length.

27. A digital-filter system comprising:

an FIR filter circuit connected to receive data from, and output filtered data to, a sample capture and data-type conversion circuit;

the FIR filter circuit further comprising:

at least one filter sub-circuit for performing digital-filtering calculations;

each of the at least one filter sub-circuit further comprising clocked registers for data and filter coefficients;

a clock-generation circuit connected to the clocked registers of the at least one filter sub-circuit;

the clocked registers of the at least one filter sub-circuit selectively enabled by the clock-generation circuit, corresponding to pre-determined values of filter-tap length, so as to only enable the number of the at least one filter sub-circuit required to perform digital-filtering calculations for the pre-determined filter-tap length.

28. The digital filter system of claim 27 where the number of filter sub-circuits is four.

29. The digital filter system of claim 28 where the clocked registers of the filter sub-circuits are selectively enabled by the clock-generation circuit, corresponding to pre-determined values of filter-tap length, so as to only enable the number of the filter sub-circuits required to perform digital-filtering calculations for the pre-determined filter-tap length.

30. The digital filter system of claim 27 where each filter sub-circuit permits calculation of 64-tap non-symmetric digital filters.

31. The digital filter system of claim 27 where each filter sub-circuit permits calculation of 128-tap symmetric digital filters.

32. The digital filter system of claim 27, where the clocked registers of each filter sub-circuit further comprise:

address registers; and, data registers, coefficient registers, and an accumulator register connected to the address registers.

33. The digital filter system of claim 32, further comprising a clock-gating circuit associated with each clocked register, so as to enable each register only for the number of clock cycles required to perform the filtering calculations for the pre-determined filter-tap length.

34. The digital filter system of claim 27, where the clock-generation circuit further comprises:

a boot oscillator; and, a clock-gating circuit for selectively enabling clock lines to the filter sub-circuits according to the pre-determined filter tap length.

* * * * *